US006459587B1

(12) United States Patent
Chan

(10) Patent No.: US 6,459,587 B1
(45) Date of Patent: Oct. 1, 2002

(54) MODULAR SUPPORT AND CASING FOR ELECTRICAL AND ELECTRONIC CIRCUIT CONSTRUCTION

(76) Inventor: Eric K. D. Chan, 18 Crown Steel Drive, Suite 101-106, Markham, Ontario (CA), L3R 9X8

( * ) Notice: Subject to any disclaimer, the term of this patent is extended or adjusted under 35 U.S.C. 154(b) by 0 days.

(21) Appl. No.: 09/676,087

(22) Filed: Oct. 2, 2000

(51) Int. Cl.[7] .......................... H05K 7/00; H05K 1/14; H05K 1/03; H02G 5/00
(52) U.S. Cl. ...................... 361/728; 361/736; 361/800; 174/68.2; 174/255; 174/58
(58) Field of Search ............................ 174/35 R, 35 C, 174/356 GC, 68.2, 68.3, 250, 255–261, 52.1–52.9, 53–64, 50.5, 50.51–50.59, 95–97; 211/41.7–41.18; 361/600–825

(56) References Cited

U.S. PATENT DOCUMENTS 4,730,232 A * 3/1988 Lindberg .................. 361/381
5,012,390 A * 4/1991 Erbele ..................... 361/413
5,699,235 A * 12/1997 Tsurumiya ................ 361/803
6,053,764 A * 4/2000 Curry ...................... 439/557

* cited by examiner

Primary Examiner—David Martin
Assistant Examiner—Michael L. Lindinger
(74) Attorney, Agent, or Firm—David W. Wong

(57) ABSTRACT

A modular support and casing is provided with a selected circuit breadboard and circuit testing module for circuit construction and testing. Electrical and electronic components may be removably and interchangeably mounted on the circuit breadboard for constructing an electrical or electronic circuit in circuit development. A plurality of selective side plates are slidably and securely mounted on the longitudinal side edge portions of the support base. Auxiliary components such as switches and connectors may be conveniently provided in pre-formed openings on these side plates for ease in the circuit construction. A top cover is provided to maintain the side plates securely in place. The side plates form the side panels of the cover to provide a complete enclosure for protecting the electrical or electronic circuit thus constructed.

9 Claims, 9 Drawing Sheets

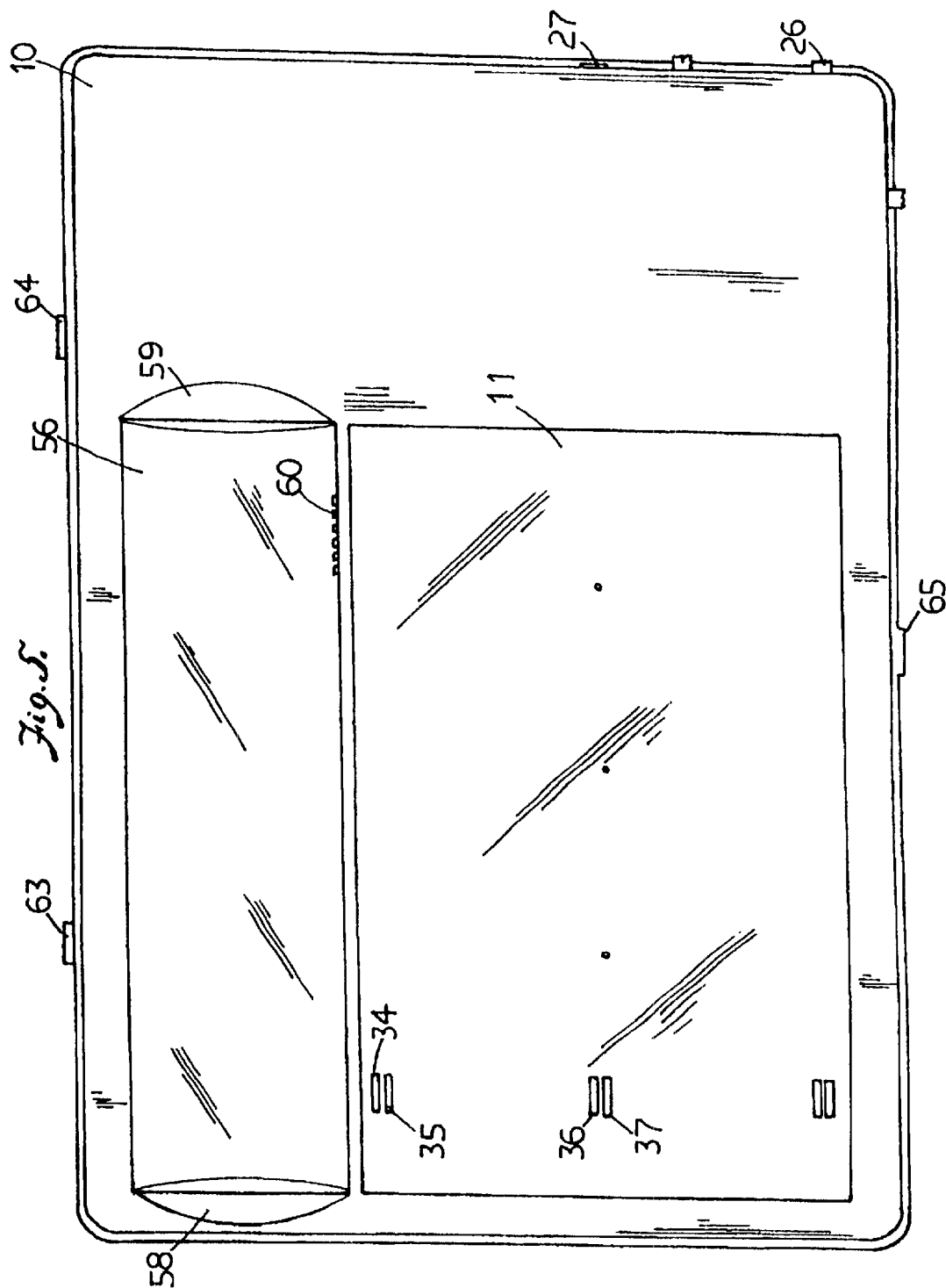

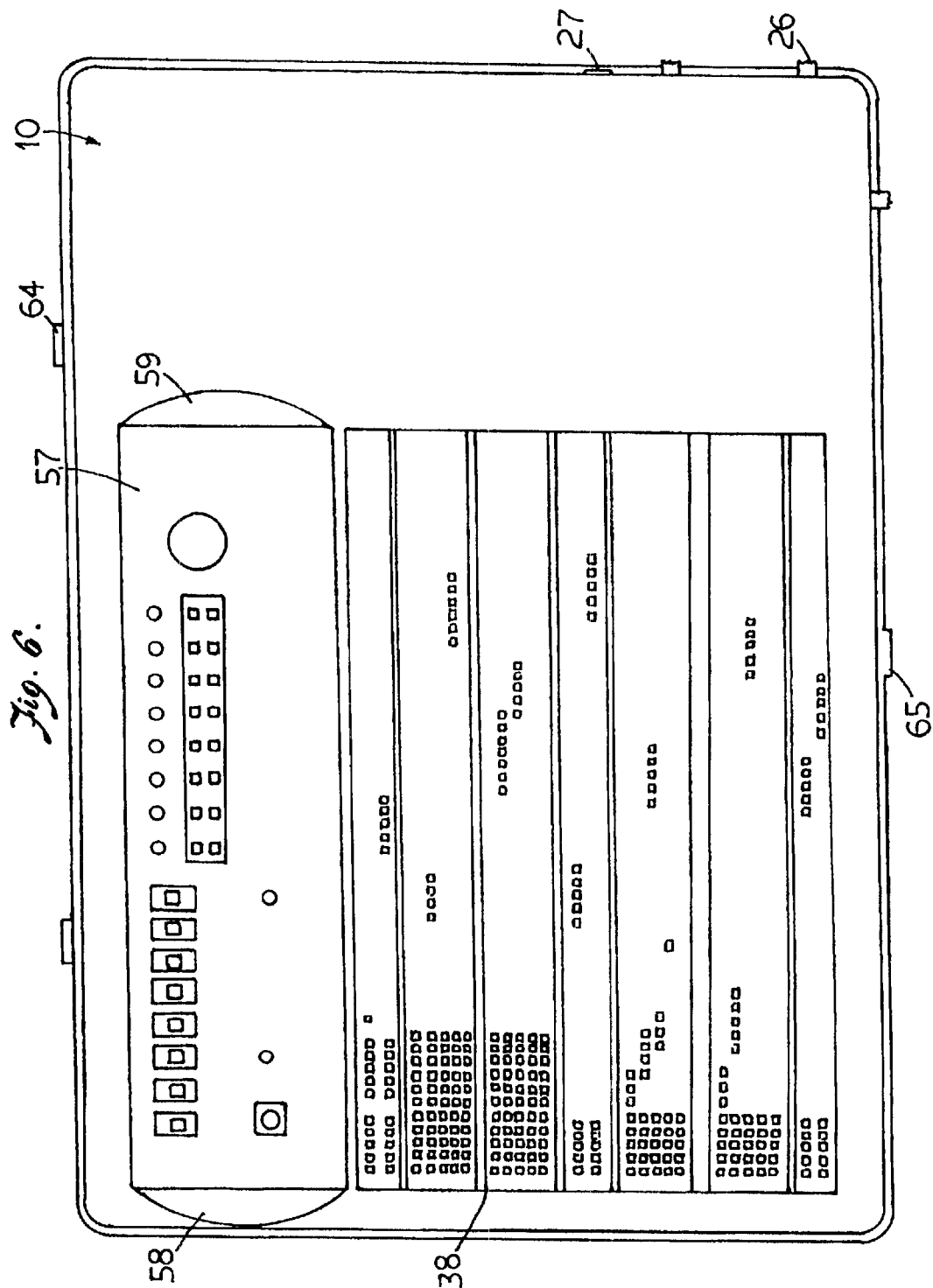

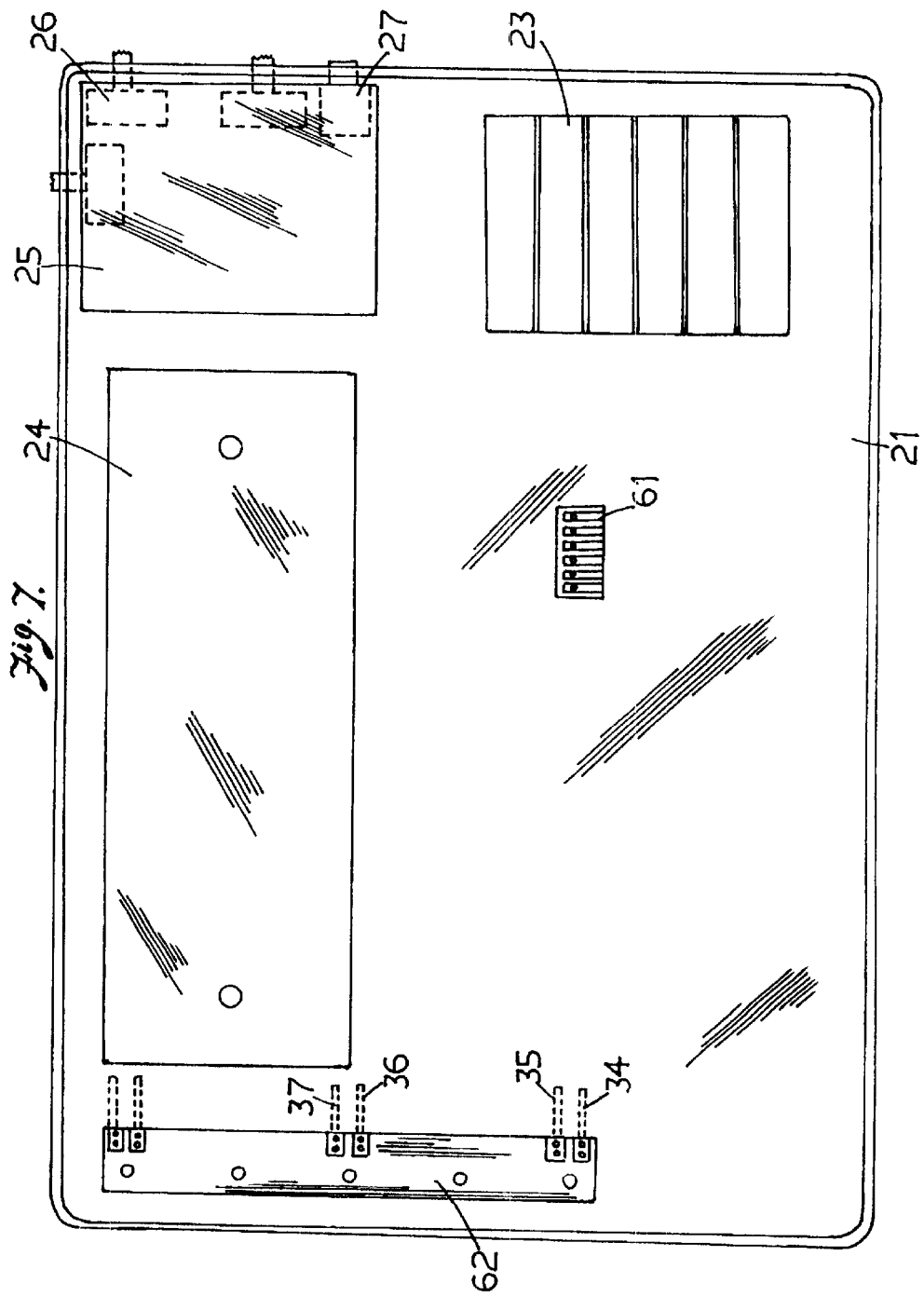

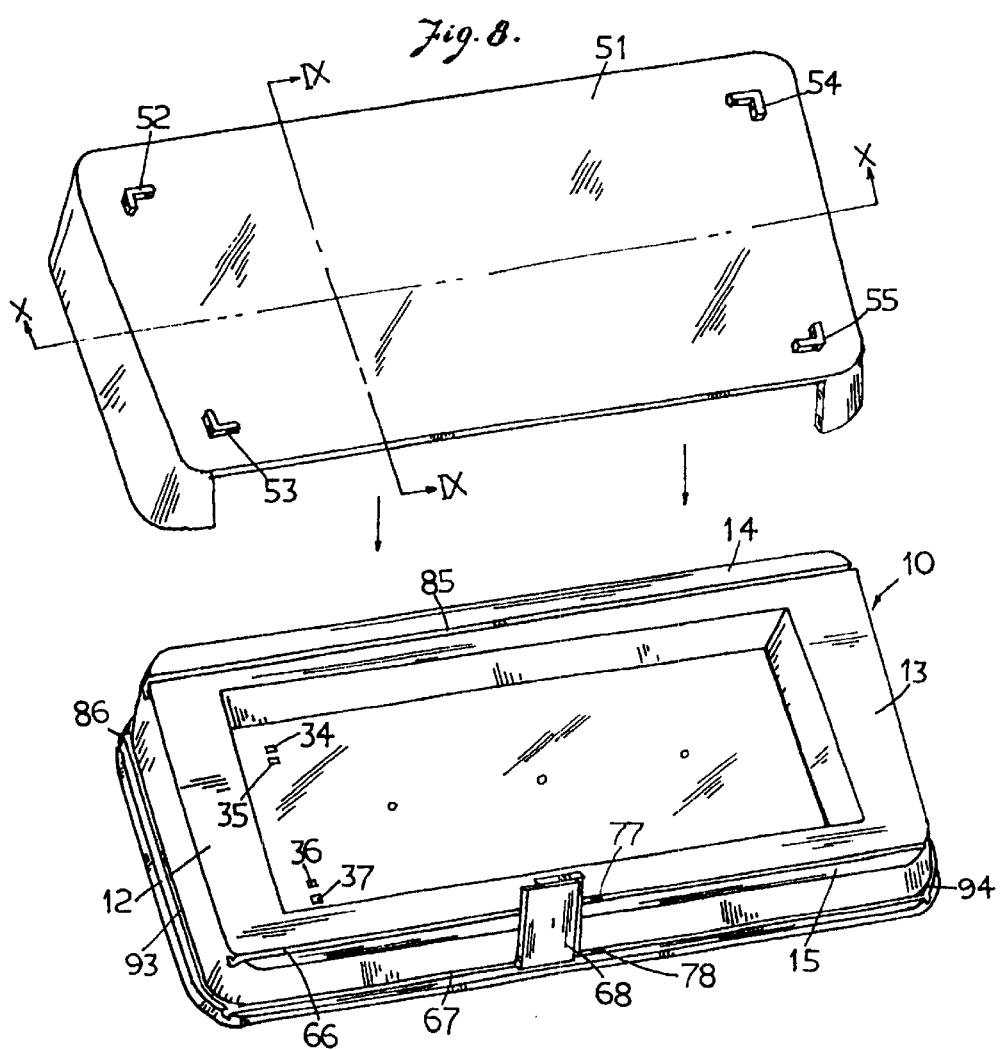

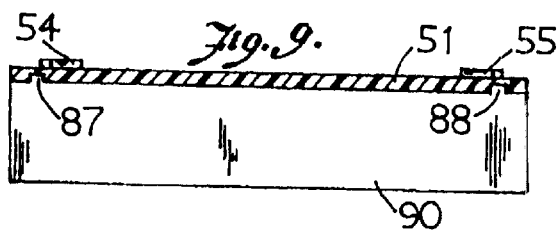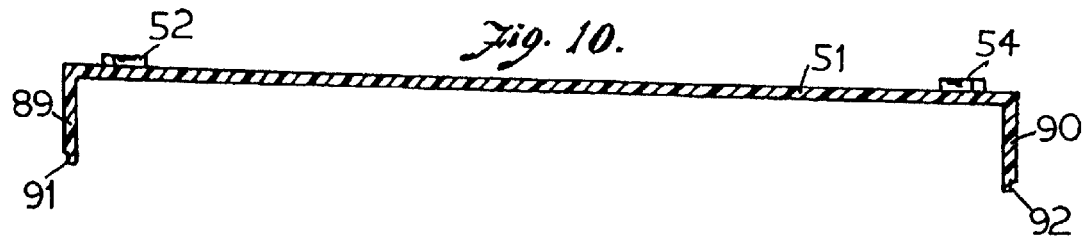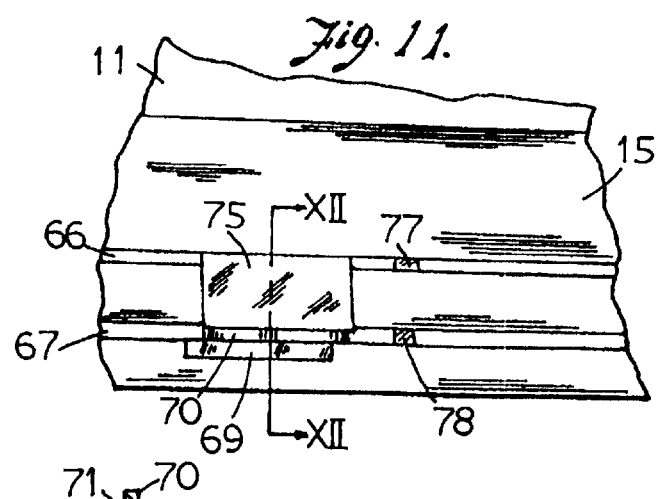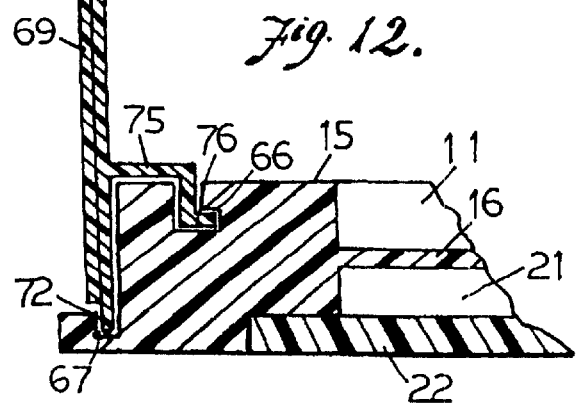

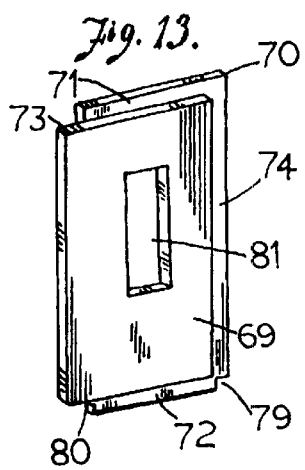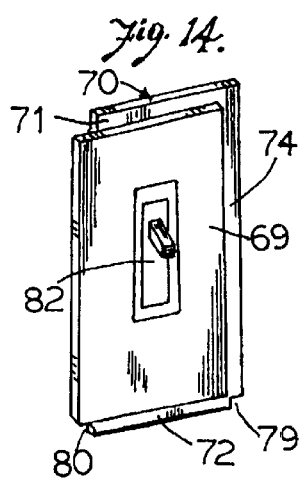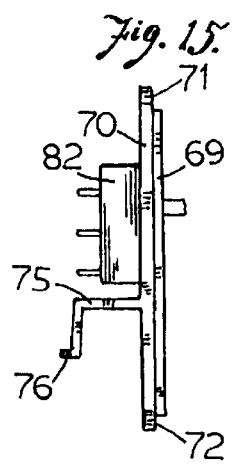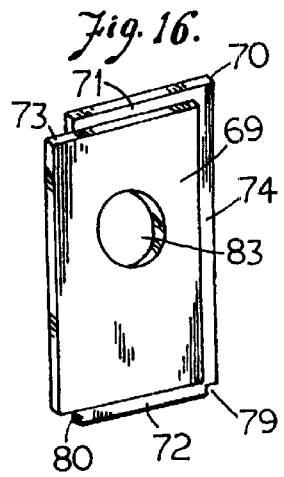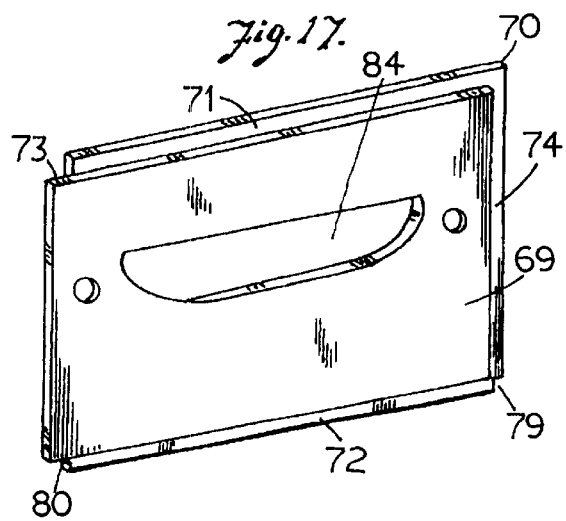

MODULAR SUPPORT AND CASING FOR ELECTRICAL AND ELECTRONIC CIRCUIT CONSTRUCTION

BACKGROUND OF THE INVENTION

This invention relates to a support for constructing an electrical or electronic circuit, and more particularly relates to a compact modular support and casing used for the construction of an electrical or electronic circuit in a developmental stage.

In constructing an electrical or electronic circuit particularly for experimental or developmental purposes, it is often necessary to make numerous changes of the electrical components in order to obtain the desired circuit. Heretofore, in constructing an electrical or electronic circuit, the electrical components are affixed to a support such as a printed circuit board by soldering their leads and the connection wiring to metal tracings provided on the printed circuit board. When changes in the circuit are required, it is necessary to remove or replace the selected electrical components from the printed circuit board by de-soldering them therefrom and then soldering the new replacement components thereto. Such operation is awkward and difficult and more often frustrating to carry out particularly for a complex circuit having numerous electrical components and wiring interconnecting to various points in the circuit.

The above drawback of using a printed circuit board has been alleviated with the use of a circuit support commonly referred to as a "breadboard" which consists of a rectangular plastic board having a plurality of parallel rows and columns of bus bars provided at its bottom surface. A plurality of through openings are formed in the board such that electrical components may be interconnected by merely inserting their leads through the openings for connecting to selected bus bars. However, the circuit breadboard is not provided with any power supply and bare live connection terminals are normally directly mounted at one of its edge portion for connection to external power supply source or to other circuit testing equipment. Therefore, the circuit constructed on the breadboard per se is not self-contained and self-operative. Moreover, in order to preserve the circuit, the breadboard with the electrical components mounted thereon must be placed within a suitable enclosure. The enclosure must then be modified to accept auxiliary components such as switches, connectors etc., for operating the circuit. The entire procedure is tedious and the completed unit is rather untidy and not well protected such that it may be easily damaged.

Another problem with either printed circuit board or circuit breadboard support is the difficulty of providing supports for auxiliary components such as toggle switches, connection ports, and display etc., for the circuit. There is no provision for mounting these components directly on the board in order that connection to such auxiliary components may be made during the construction of the circuit. Therefore, openings must be made in the side and top panels of the protective enclosure which is commonly a plastic box, for mounting such auxiliary components. These openings are commonly formed by cutting or sawing the side and top panels of the plastic box. Such operation is often difficult and very frustrating to carry out as the panels of the plastic box particularly the side panels would often break in the cutting and sawing operations; and even if the cutting and sawing operations are successful, the openings thus formed are rather unkempt.

Moreover, the operation of the circuit thus constructed must be tested with various complex and expensive testing equipment and electrical supply must be provided by external complex equipment which are normally designed for general testing purposes. Such general purpose testing equipment are expensive and bulky in size and they are usually not affordable for a circuit developer and particularly for a student learning to develop an electrical or electronic circuit.

SUMMARY OF THE INVENTION

It is a principal object of the present invention to provide a compact modular support in which electrical components may be easily and quickly installed or replaced.

It is another object of the present invention to provide a modular support having interchangeable side plates for mounting auxiliary components for easy building of an electrical or electronic circuit.

It is yet another object of the present invention to provide a cover engageable with the interchangeable side plates to form a secure protective enclosure for the circuit.

It is still another object of the present invention to provide a modular support in which various selective compact testing module may be interchangeably mounted therein for testing the operation of the circuit constructed.

It is another object of the present invention to provide a modular support having its own alternate power supply.

It is another object of the present invention to provide a modular support suitable for constructing development model of digital and analog circuits.

BRIEF DESCRIPTION OF THE DRAWINGS

FIG. 5 is a top elevation view of the second embodiment of the support according to the present invention having provision for interchangeable testing modules to be mounted therein.

FIG. 6 is a top elevation view of the second embodiment of the support with the breadboard and testing module mounted therein.

FIG. 7 is a bottom elevation view of the second embodiment of the support.

FIG. 8 is a perspective top elevation of the embodiment having mounting slots formed in the longitudinal side edge portions of the base with a side plate removably mounted thereon.

FIG. 9 is a cross sectional side elevation view of the U-shaped cover along section line IX—IX in FIG. 8.

FIG. 10 is a cross sectional front elevation view of the U-shaped cover along section line X—X in FIG. 8.

FIG. 11 is an isolated top elevation view of the longitudinal side edge portion of the base with a side plate slidably mounted thereon.

FIG. 12 is a cross sectional side elevation view along cross section line XII—XII in FIG. 11.

FIG. 13 is a perspective front elevation view of a side plate with a pre-formed opening for mounting a switch.

FIG. 14 is a perspective front elevation view of the side plate of FIG. 13 with the switch mounted thereon.

FIG. 15 is a perspective side elevation of FIG. 14.

FIG. 16 is a perspective front elevation view of the side plate having a pre-formed opening for mounting a round shape auxiliary electrical component such as an indicator light.

FIG. 17 is a perspective front elevation view of another side plate having a pre-formed opening for mounting a multi-pin connector such as a power source connector.

DETAILED DESCRIPTION OF THE PREFERRED EMBODIMENTS

Figure 1:
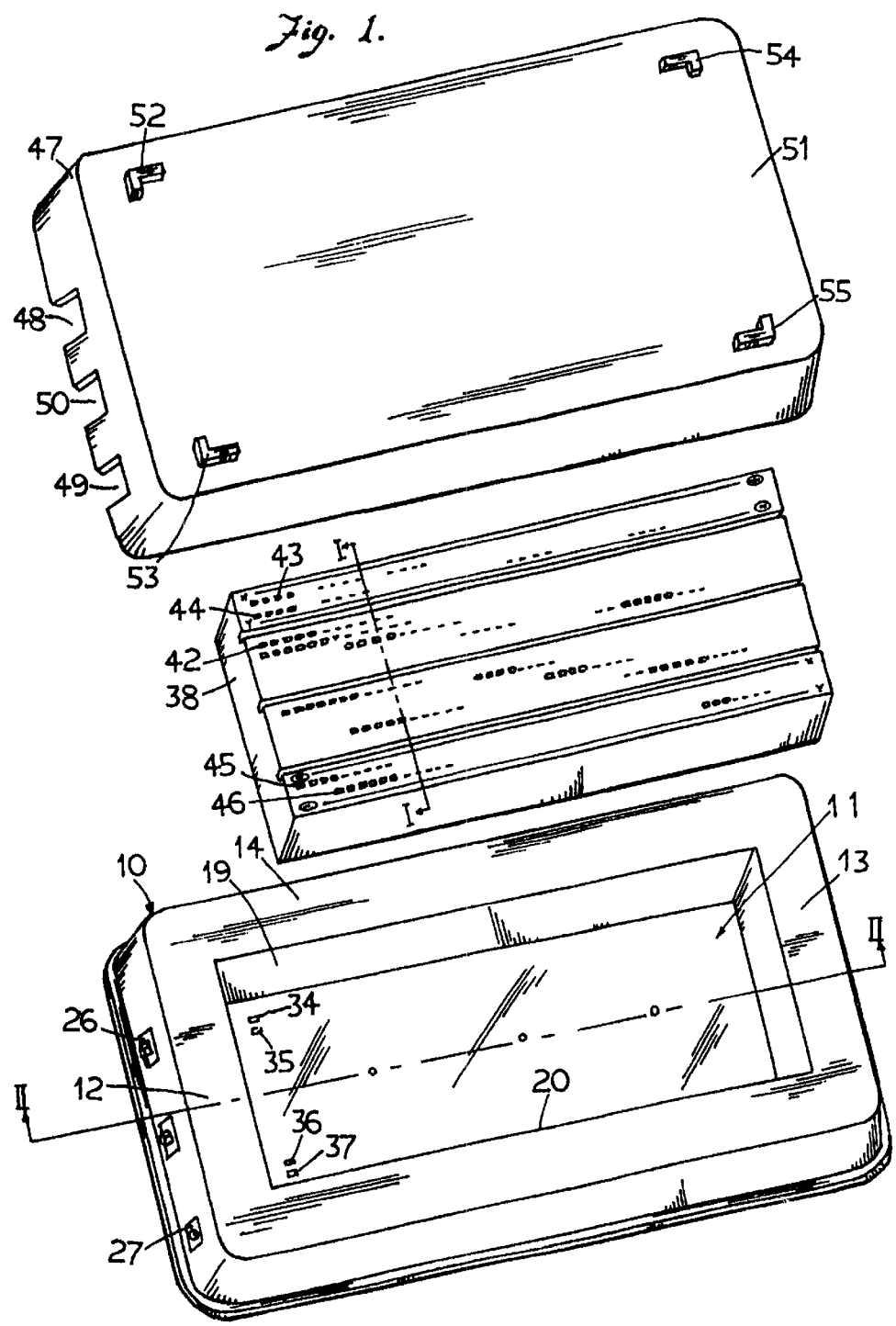
FIG. 1 is a perspective exploded top elevation view of the support according to the present invention.
Figure 1A:
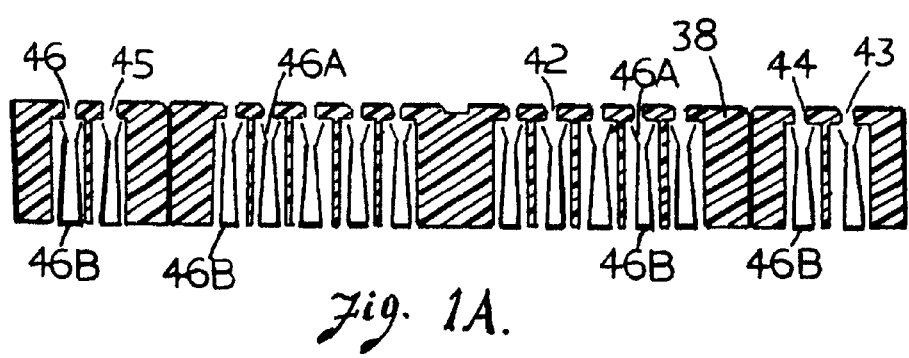
FIG. 1A is an enlarged cross sectional view along section line I—I in FIG. 1.

With reference to the drawings wherein like reference numerals designate corresponding parts in the several views, the support of the present invention has a substantially rectangular base 10 having a top rectangular depression 11 therein. The depression 11 is bounded by two upstanding mutually parallel short side edge portions 12 and 13, and two upstanding mutually parallel longitudinal side edge portions 14 and 15 and a bottom panel 16 so that the depression 11 has upright short side walls 17 and 18 and upright longitudinal side walls 19 and 20. The base 10 has a bottom interior compartment 21 which may be enclosed with a bottom cover plate 22. A rectangular auxiliary compartment 23 is located in the base 10 for housing batteries operative for providing alternate power supply for the circuit constructed on the base.

A rectangular metal plate 24 is located in the interior compartment 21 to serve as a heat sink for dissipating the heat generated by the electrical components in the operation of the circuit, and a printed circuit board 25 for mounting various control electrical components are also located in the interior compartment 21. Control switches 26 and external electrical power connection receptacle 27 may be mounted directly to one of the upstanding edge portion such as edge portion 12 as shown in FIG. 1, for connecting to an external power supply source.

Figure 2:
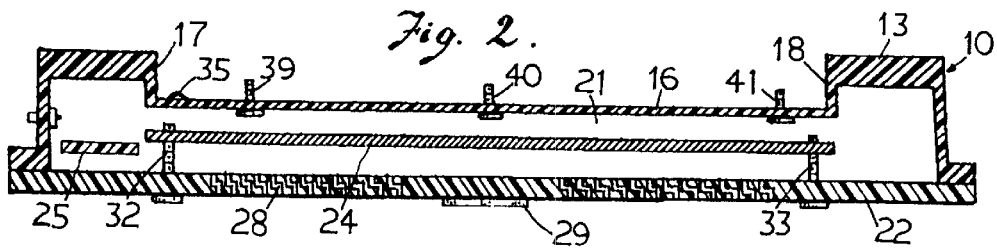
FIG. 2 is a cross sectional side view of the support along section line II—II in FIG. 1.
Figure 3:
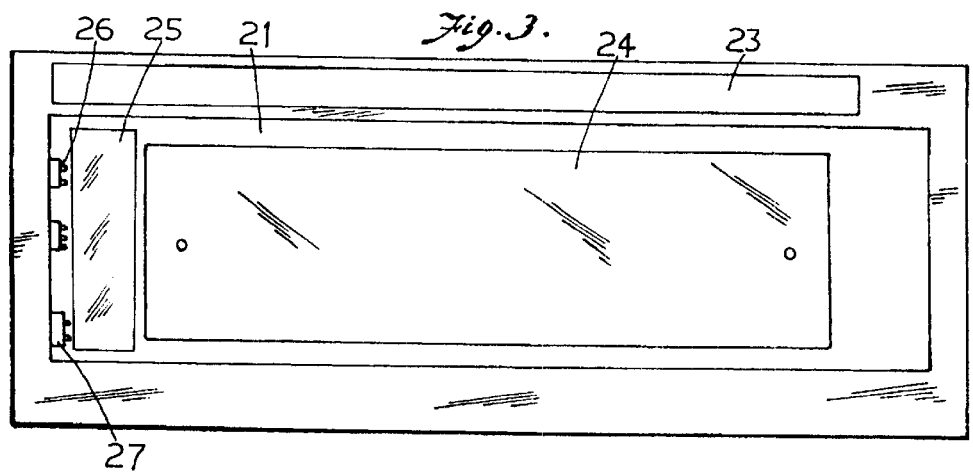
FIG. 3 is a bottom elevation view of the support with the bottom cover plate removed.

A plurality of ventilation openings 28 are formed in the bottom cover plate 22. The ventilation openings 28 are located directly below the heat sink metal plate 24 to facilitate the heat of the heat sink to escape from the interior compartment 21. These ventilation openings 28 may be in the form of louvers or elongated slots having a zigzag channel as best shown in FIG. 2 to prevent outside object from falling easily into the interior compartment 21 when the support is placed up side down. It can be appreciated by those skilled in the art that the ventilation openings may be in other shape such as circular to serve the same purpose.

Figure 4:
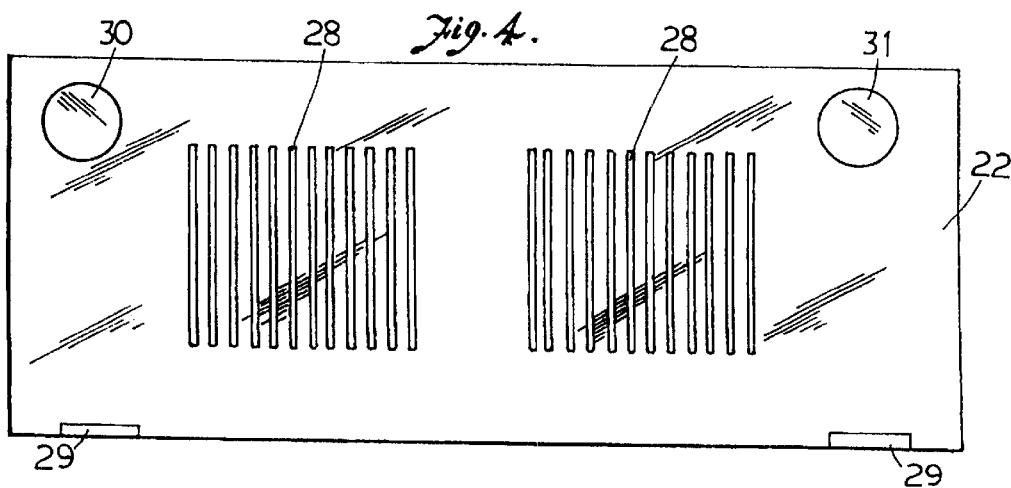
FIG. 4 is a bottom elevation view of the bottom cover plate.

Integral support legs 29 are formed adjacent to two opposite corners of the cover plate 22 as best shown in FIG. 4 and two additional support legs 30 and 31 may also be provided adjacent to the other two corners of the cover plate 22. The heat sink metal plate 24 may be mounted on the bottom cover plate 22 by two bolts 32 and 33. Two pairs of spring electrical contacts 34, 35 and 36, 37 are provided on the bottom panel 16 of the depression 11. These electrical contacts 34 through 37 are connected to the power supply.

A rectangular circuit mounting board commonly referred to as a "breadboard" 38 is mounted in the depression 11 such as by securing bolts 39, 40 and 41 extending through the bottom panel 16 of the depression 11 as best shown in FIG. 2. The breadboard 38 has a plurality of parallel rows and column of conductive bus bars provided at its underside and it has a plurality of rows and columns of through openings 42, 43 44 45 and 46 formed therein. Connectors 46A are located in the through openings and extending upwards from the corresponding rows and columns of bus bars 46B such that the leads of electrical components and wiring may be inserted into the openings to connect with selected bus bars through the connectors to form the desired electrical circuit. Selected bus bars of the breadboard 38 will contact predetermined ones of the spring electrical contacts 34, 35, 36 and 37 when the breadboard 38 is located in the depression 11. The two upper rows of openings 43 and 44, and the two lower rows of openings 45 and 46 are designated for connection to the electrical power supplies; and the bus bars associated with these openings are those in contact with the spring electrical contacts 34,35, 36 and 37 located on the bottom panel of the depression 11. Normally for electronic circuits the power supplies are ±5 volts and ±12 volts.

An upper cover 47 is provided for covering over the base 10 to protect the circuit constructed on the breadboard 38. Cut outs 48 and 49 are formed in the side wall of the cover 47 to accommodate the switch 26 and external power supply connector 27 respectively. Additional cut out such as cut out 50 may be provided to accommodate additional components mounted at the edge portion of the base 10. The top panel of the cover 47 has a flat upper surface 51. Openings may be formed in the top panel for mounting selected electrical components such as a display, indicator lights and timers etc. Four L-shaped abutments 52, 53, 54 and 55 are formed adjacent to four corners of the top surface so that a template may be conveniently and precisely placed on the top panel of the cover, guided by the abutments, for forming the required openings accurately for mounting such electrical components. It can be appreciated that the unit thus constructed is sturdy, self-contained and self-operative.

A second rectangular depression 56 may be formed in a larger base 10 as best shown in FIG. 5 to facilitate a selected testing module 57 to be interchangeably mounted in the base 10. Also, breadboards having various selected configurations may be mounted in the depression 11 having additional pairs of spring electrical contacts provided at its bottom panel to provide the electrical supplies for operating the circuit. Three pairs of such spring electrical contacts are shown for illustration purposes in FIG. 5 to provide any additional electrical supply voltage such as ±9 volts for operating the circuit constructed on the breadboard. Power supply voltages of ±5 volts, ±9 volts, and ±12 volts are the common operating voltages for electronic analog and digital circuits. Accordingly, no complex power supply is required, and the power supply may be provided by a simple wall receptacle direct plug-in power supply transformer connected to the support through the power supply connector 27. An alternate power supply may also be provided with batteries located in the battery compartment 23.

Selected relatively simple testing modules designed for performing various testing functions may be interchangeably mounted in the depression 56 to perform the particular testings required. Such testing modules may be provided with much less costs and yet much more convenient to use than the common expensive multi-function complex testing equipment which are designed to perform numerous testing operations many of which may not be required for the electrical or electronic circuit concerned.

Two pivotal spring latch arrangements 58 and 59 are provided on the two sides of the second depression 56 so that the testing module 57 may be inserted into the depression 56 with a snap action to be held in place securely by the spring latch arrangements 58 and 59, and it may be removed from the depression 56 by simply depressing the spring latch arrangements 58 and 59 downward with a sideway pivotal movement to disengage and to remove the testing module 57 from the depression 56. Electrical contact strips 60 are provided on the side wall of the depression 56 and associated electrical contact strips are provided on the side wall of the testing module so that the contact strips and associated contact strips will engage with one another when the testing module is mounted within the depression 56 to provide the operating electrical supply and electrical connection to the circuit. The terminal block 61 of the contact strips 60 is located in the interior compartment 21 as best shown in FIG. 7; and the terminal block 62 of the spring contacts for the breadboard is also located in the interior compartment for connection to the power supply.

The second depression 56 also serves as a convenient provision for adding more breadboards in the support, if required.

Hinges 63 and 64 may be provided on an edge of the base 10 for the top cover 51 to be removably mounted thereto; and a latch 65 may be provided on the edge opposite to the hinges 63 and 64 together with an associated latch provided on the top cover 51 so that the latch and associated latch are operative to lock the top cover 51 in the closed position so as to provide a completely secure enclosure for the circuit.

As shown in FIG. 8, an elongated slot 66 having an L-shaped cross section is formed in the longitudinal side edge portion 15 of the base 10 and a second elongated slot 67 is also formed on an extension peripheral rim around the lower edge portion of the base 10 and located juxtaposed to the outer side wall of the edge portion 15. Both elongated slot 66 and second elongated slot 67 extend throughout the entire length of the base 10 and are opened at both ends therein so that a plurality of side plates 68 may be slidably mounted to the base 10 by sliding sideways through the opened ends of the slots 66 and 67. Each side plate 68 has a front plate portion 69 and an integral rear plate portion 70. The front plate portion 69 is shorter in vertical length than the rear plate portion 70 such that a short top edge portion 71 and a short bottom edge portion 72 extend beyond the corresponding top edge and bottom edge respectively of the front plate portion 69. Also, a short vertical side edge portion 73 of the front plate portion 69 extends outwards beyond the corresponding vertical side edge portion of the rear plate portion 69, similarly a short vertical side edge portion 74 of the rear plate portion 69 extends beyond the corresponding vertical side edge of the front plate portion 69. The rear plate portion 69 has a double L-shaped extension base 75 which has an L-shaped bottom edge portion 76. The side plate 68 may be slidably mounted to the base 10 by sliding sideways to engage the L-shaped bottom edge portion 76 with the L-shaped elongated slot 66 and also the short bottom edge portion 72 of the rear plate portion 70 would simultaneously engage with the second elongated slot 67 on the periphery rim of the base 10 such that the side plate 68 is securely held in place.

A reinforcing retainer 77 located in the middle of the elongated slot 66 may be integrally formed in the base 10 in order to strengthen the outer edge portion of the elongated slot 66. Similarly a reinforcing retainer 78 is also formed in the middle of the elongated slot 67. With such provision, right angle cut outs 79 and 80 are formed in the lower corners of the rear plate portion of the side plate 68 and similar cut outs are also formed in the L-shape bottom edge portion 76 so that the retainers 77 and 78 would not interfere with the engagement between adjacent side plates located and the middle of the base 10.

Pre-formed accurate openings having predetermined shapes such as a rectangular opening 81 for mounting a common switch 82, or a circular opening 83 for mounting indicator light, or an arcuate opening 84 for mounting a conventional multi-port connector may be formed in the side plates such that such auxiliary electrical components may be conveniently mounted on the side plates 68 so that electrical connection between the breadboard and the auxiliary electrical components may be readily and easily made during the construction of the circuit. The short vertical portions 74 and 68 of the rear plate portion and front plate portion respectively of adjacent side plates engage with one another to provide a closed joint.

Similarly, an additional L-shaped cross section elongated slot 85 may be formed on the edge portion 14 of the base 10 and another longitudinal elongated slot 86 formed on the peripheral rim of the base 10 and located adjacent to the outer side wall of the edge portion 14 so that additional side plates 68 may also be slidably mounted on the edge portion 14 of the base 10. The top cover 51 for this embodiment has opened longitudinal sides and mating longitudinal elongated slots 87 and 88 are formed in its underside adjacent its opened longitudinal side edge portions. These mating longitudinal slots 87 and 88 will engage with the top short edge portion of the rear plate portion of the side plates to hold the latter firmly in place once the top cover 51 is placed over the base 10.

The lower edges of the side walls 89 and 90 are provided with recessed lips 91 and 92 which will engage with two side slots 93 and 94 formed at the peripheral rim of the base 10 to form an intimate joint.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within scope of the invention.

I claim:

1. A modular support for constructing an electrical circuit, comprising a base having a rectangular depression formed in a top surface therein, and having a rectangular open bottom interior compartment, a plurality of electrical contacts formed on top of a bottom panel of said depression, a circuit breadboard member mounted in said depression, said circuit breadboard member having a plurality of conductive bus bars formed at an underside therein, said conductive bus bars being in contact with predetermined ones of said electrical contacts, said circuit breadboard member having a plurality of connection openings formed therein, connectors located in said connection openings and extending upwards from said bus bars and adapted for engaging with conductive leads of electrical components removably inserted through said connection openings for connecting to selected bus bars, a metal heat sink member located in said bottom interior compartment and positioned below said circuit breadboard member, said open bottom interior compartment being covered by a cover plate having a plurality of ventilation openings formed therein, and said ventilation openings being located below said heat sink member, a connector member mounted on a side wall of said bottom interior compartment, said connector member having electrical terminals connected to said electrical contacts in said bottom panel, and said connector member being adapted for connection to an external power source for supplying electrical power to said electrical circuit, a rectangular second depression formed in said top surface of said base and adapted for receiving a circuit testing module removably mounted therein.

2. A modular support for constructing an electrical circuit, comprising a base having a rectangular depression formed in a top surface therein, and having a rectangular open bottom interior compartment, a plurality of electrical contacts formed on top of a bottom panel of said depression, a circuit breadboard member mounted in said depression, said circuit breadboard member having a plurality of conductive bus bars formed at an underside therein, said conductive bus bars being in contact with predetermined ones of said electrical contacts, said circuit breadboard member having a plurality of connection openings formed therein, connectors located in said connection openings and extending upwards from said bus bars and adapted for engaging with conductive leads of electrical components removably inserted through said connection openings for connecting to selected bus bars, a metal heat sink member located in said bottom interior compartment and positioned below said circuit breadboard member, said open bottom interior compartment being covered by a cover plate having a plurality of ventilation openings, formed therein, and said ventilation openings being located below said heat sink member, a plurality of side plates interchangeably and removably mounted on side edge portions of said base, said side plates being adapted for mounting electrical auxiliary components to said base.

3. A modular support according to claim 2 wherein each side plate of said plurality of side plates has a downwardly extending front leg member having a straight bottom end, and a rear leg member extending parallel to and spaced from said front leg member, said rear leg member having an inverted L-shaped bottom end.

4. A modular support according to claim 3 wherein an open-end elongated slot having an L-shaped cross section is formed in each one of two opposite side edge portions of said base, and an associated open-end elongated slot is formed on a peripheral rim of said base and located juxtaposed to each one of said two opposite side edge portions of said base, said elongated slot being adapted to engage with said inverted L-shaped bottom end of said side plate and said associated elongated slot being adapted to engage with said straight bottom end of said side plate when said side plate is slidably and removably mounted to said base.

5. A modular support according to claim 4 wherein said side plate has a pre-formed opening having a predetermined shape provided therein adapted for mounting an auxiliary components for said circuit.

6. A modular support according to claim 5 wherein said side plate includes a front plate portion and a rear plate portion, said rear plate portion having a short upper edge portion and a short bottom edge portion extending beyond corresponding edges of said front plate portion.

7. A modular support according to claim 6 wherein said front plate portion has a short vertical side edge portion extending beyond an adjacent vertical side edge of said rear plate portion, and said rear plate portion also has one short vertical side edge portion extending beyond adjacent vertical side edge of said front plate portion.

8. A modular support according to claim 7 including a top cover having two opened longitudinal sides, and an elongated channel formed in an underside of said top cover adjacent to each one of said opened sides and adapted to engage with said short upper edge portion of said side plates to hold said side plates securely in place.

9. A modular support according claim 6 including an integral retainer formed in a middle portion of said elongated slot and associated elongated slot, and a right angle cut out formed in both lower corners of both front leg member and rear leg member of said rear plate portion of said side plates.

* * * * *